(12) United States Patent
Glaser et al.

(10) Patent No.: US 9,287,377 B2
(45) Date of Patent: Mar. 15, 2016

(54) SEMICONDUCTOR DEVICE AND MANUFACTURING METHOD

(71) Applicant: Infineon Technologies AG, Neubiberg (DE)

(72) Inventors: Ulrich Glaser, Putzbrunn (DE); Peter Irsigler, Obernberg/Inn (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/450,387

(22) Filed: Aug. 4, 2014

(65) Prior Publication Data

US 2016/0035850 A1 Feb. 4, 2016

(51) Int. Cl.
*H01L 21/26* (2006.01)
*H01L 29/45* (2006.01)
*H01L 29/417* (2006.01)
*H01L 21/283* (2006.01)
*H01L 21/02* (2006.01)
*H01L 21/302* (2006.01)

(52) U.S. Cl.
CPC .......... *H01L 29/45* (2013.01); *H01L 21/02647* (2013.01); *H01L 21/283* (2013.01); *H01L 21/302* (2013.01); *H01L 29/417* (2013.01)

(58) Field of Classification Search
CPC ............... H01L 21/02639; H01L 29/1095; H01L 21/02521; H01L 21/76877; H01L 29/6634; H01L 29/66348; H01L 29/66727; H01L 29/66734; H01L 29/7395; H01L 21/02389; H01L 21/02458; H01L 21/76846; H01L 21/7683
See application file for complete search history.

(56) References Cited

U.S. PATENT DOCUMENTS 6,140,235 A * 10/2000 Yao et al. ............... 438/679

FOREIGN PATENT DOCUMENTS

DE 102005030466 A1 1/2007

OTHER PUBLICATIONS

Weyers, et al., "Semiconductor Device Including a Diode", U.S. Appl. No. 13/328,371, filed Dec. 16, 2011, pp. 1-51.

* cited by examiner

*Primary Examiner* — Roy Potter
*Assistant Examiner* — Paul Patton
(74) *Attorney, Agent, or Firm* — Murphy, Bilak & Homiller, PLLC (57) ABSTRACT

A semiconductor device includes a trench extending into a semiconductor body from a first surface. At least one of a ternary carbide and a ternary nitride is in the trench.

20 Claims, 9 Drawing Sheets

SEMICONDUCTOR DEVICE AND MANUFACTURING METHOD

BACKGROUND

Electrical characteristics of semiconductor devices are influenced by a number of device parts. A resistance between load terminals of a semiconductor device such as a diode or transistor, for example an insulated gate field effect transistor (IGFET) such as a metal oxide semiconductor field effect transistor (MOSFET), an insulated gate bipolar transistor (IGBT), a junction field effect transistor (JFET), a bipolar junction transistor (BJT) is determined by a semiconductor bulk, contacts and wiring, for example. Minimizing the resistance allows for a reduction of resistive losses in the semiconductor device.

It is desirable to provide a semiconductor device and manufacturing method enabling improved electrical characteristics.

SUMMARY

According to an embodiment of a semiconductor device, the semiconductor device comprises a trench extending into a semiconductor body from a first surface. At least one of a ternary carbide and a ternary nitride is in the trench.

According to another embodiment of a semiconductor device, the semiconductor device comprises a semiconductor body having opposite first and second surfaces. At least one of a nitride and a carbide is buried in the semiconductor body. A second part of the semiconductor body is between the first surface and the at least one of the nitride and the carbide. A first part of the semiconductor body is between the second surface and the at least one of the nitride and the carbide. A melting point of the at least one of the nitride and the carbide is greater than 900° C.

According to an embodiment of a method of manufacturing a semiconductor device, the method forming at least one of a nitride and a carbide on a second part of a semiconductor body. The method further comprises burying the at least one of the nitride and the carbide in the semiconductor body by forming a first part of the semiconductor body on the second part and on the at least one of the nitride and the carbide by epitaxial growth.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Specific embodiments described in this specification pertain to, without being limited thereto, to semiconductor devices, in particular to field effect semiconductor transistors, diodes, bipolar transistors and ESD protection devices. Within this specification the terms "semiconductor device" and "semiconductor component" are used synonymously. The semiconductor device typically includes a field-effect or transistor structure. The field-effect structure may be a MOSFET or an IGBT-structure having a pn-junction forming a body diode between a drift region of the first conductivity type and a body region of the second conductivity type. The semiconductor device is typically a vertical semiconductor device having two load metallizations, for example a source metallization and a drain metallization for a MOSFET, which are arranged opposite to each other and in low resistive contact with a respective contact region. The field-effect structure may also be formed by a JFET-structure.

By way of example, the semiconductor device is a power semiconductor device having an active area with, for example, a plurality of IGBT-cells or MOSFET-cells for carrying and/or controlling a load current between the two load metallizations. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the 10 Ampere to a few kA range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region or emitter region of the first conductivity type and a drift region of the first conductivity type in a MOSFET-structure and an IGBT-structure, respectively. The drift region may be in contact with a higher doped drain region of the first conductivity type or a higher doped collector region of the second conductivity type, respectively. The drain region or the collector region is in low resistive electric contact with a drain or collector electrode. The source region or emitter region is in low resistive electric contact with a source or emitter electrode. In a JFET-structure, the channel region is typically formed by a portion of the drift region of the first conductivity type arranged between a gate region and a body region of the second conductivity type, and may be controlled by changing the width of a depletion layer formed between the gate region and the channel region.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is configured to form and/or control a channel region.

By way of example, the gate electrode is implemented as trench-gate electrode, i.e. as a gate electrode which is arranged in a trench extending from the main surface into the semiconductor substrate or body. The gate electrode may also be implemented as a planar gate electrode.

A unit cell of an active area of a power field-effect semiconductor device may, in a horizontal cross-section, include a trench-gate electrode and a surrounding portion of a mesa when the trench-gate electrodes form a two-dimensional lattice, for example in the form of a checker board, when seen from above.

Alternatively, the unit cell of the active area of a power field-effect semiconductor device may, in a horizontal cross-section, include a trench-gate electrode and a respective portion of two adjoining mesas when seen from above. In these embodiments, trench-gate electrodes, mesas and unit cells may form respective one-dimensional lattices.

Figure 1:
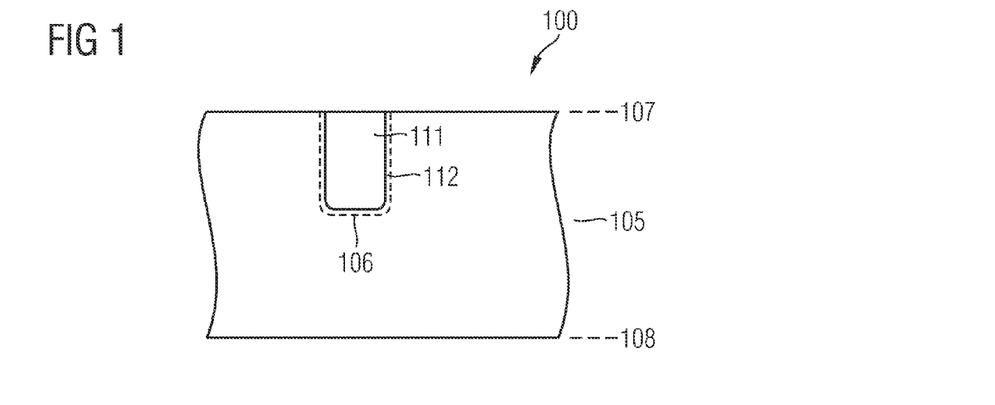
FIG. 1 is a schematic cross-sectional view of a semiconductor body for illustrating a semiconductor device including a structure comprising at least one of a ternary carbide and a ternary nitride in a trench.

A schematic cross-sectional view of a semiconductor body 105 of a semiconductor device 100 according to an embodiment is illustrated in FIG. 1.

The semiconductor device 100 includes a trench 106 extending into the semiconductor body 105 from a first surface 107, for example a front surface opposite to a second surface 108, for example a back surface. A structure 111 in the trench includes at least one of a ternary carbide and a ternary nitride.

According to an embodiment, the at least one of the ternary carbide and the ternary nitride is $A_xB_yR_z$, A being one of Sc, Ti, Cr, V, Zr, Nb, Mo, Hf, and Ta; B being one of Al, Si, P, S, Ga, Ge, As, Cd, In, Sn, Te, and Pb; R being one of C and N; and [x,y,z] being one of [2,1,1], [3,1,2], [4,1,3]. Examples for [3,1,2] are $Ti_3AlC_2$, $Ti_3GeC_2$, $Ti_3SiC_2$. An example for [4,1,3] is $Ti_4AlN_3$.

According to another embodiment, an optional contact layer 112 is arranged between the at least one of the ternary carbide and the ternary nitride and the semiconductor body 105. The contact layer may be a silicide or a highly doped semiconductor such as a p+-doped or n+-doped layer. The contact layer 112 may be arranged at an electric contact interface between the at least one of the ternary carbide and the ternary nitride and the semiconductor body 105 and may be absent outside of the electric contact interface.

According to another embodiment, the optional contact layer 112 may be arranged at a part of the contact interface between the at least one of the ternary carbide and the ternary nitride and the semiconductor body 105, for example a sidewall and/or the bottom side.

Figure 2A:
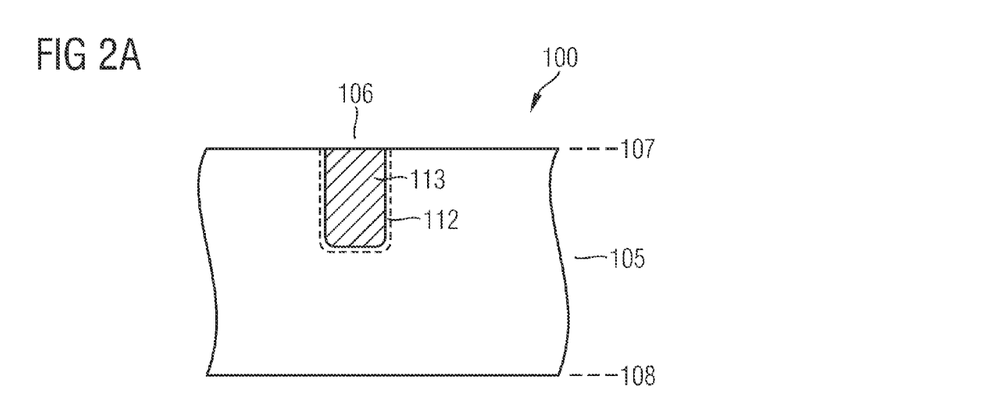
FIGS. 2A to 2I and FIGS. 3A to 3C illustrate different embodiments of the structure of FIG. 1.

According to an embodiment illustrated in the schematic cross-sectional view of FIG. 2A, at least one 113 of the ternary carbide and the ternary nitride fills the trench 106 completely.

Figure 2B:
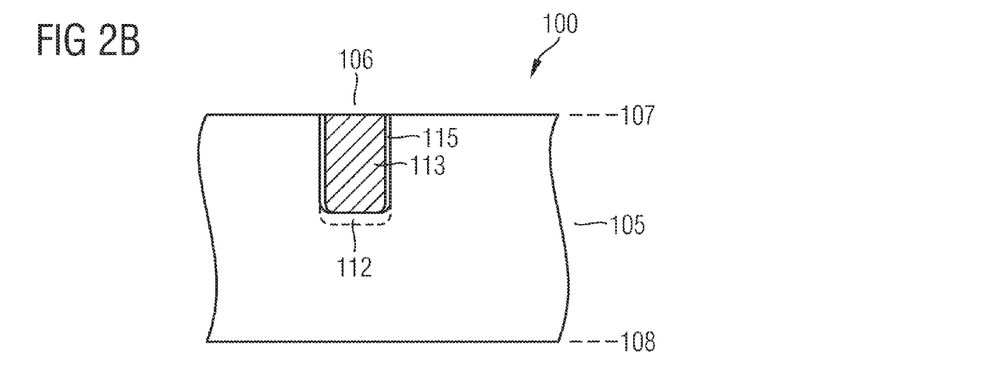

According to another embodiment illustrated in the schematic cross-sectional view of FIG. 2B, a dielectric 115 is arranged between the at least one of the ternary carbide and the ternary nitride 113 and a sidewall of the trench 106. The dielectric provides a lateral electric isolation between the at least one of the ternary carbide and the ternary nitride 113 and the semiconductor body 105. The dielectric 115 may be an oxide, e.g. a silicon oxide and/or a nitride, e.g. a silicon nitride and may comprise any other dielectric material(s) configured to provide electric isolation. The at least one of the ternary carbide and the ternary nitride 113 adjoins the semiconductor body 105 at a bottom side of the trench 106.

Figure 2C:
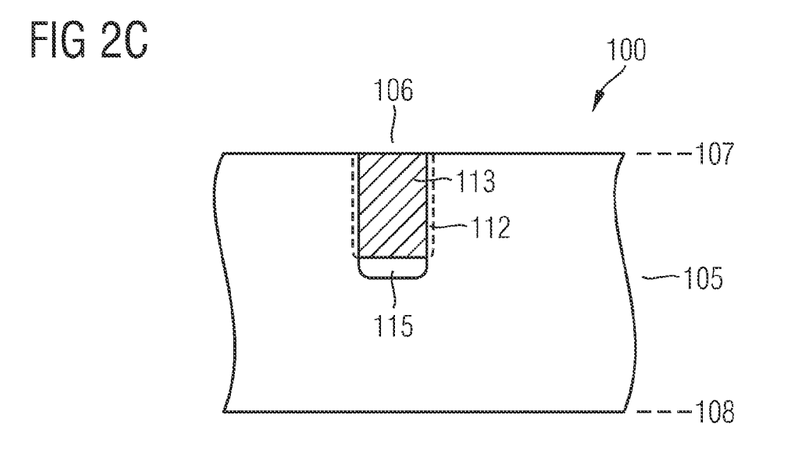

According to another embodiment illustrated in the schematic cross-sectional view of FIG. 2C, the dielectric 115 is arranged between a bottom side of the at least one of the ternary carbide and the ternary nitride 113 and the semiconductor body 105. The dielectric 115 allows for an electric isolation of the at least one of the ternary carbide and the ternary nitride 113 to a bottom side. An electric contact to the semiconductor body 105 is effected through a sidewall of the trench 105, e.g. supported by the optional contact layer 112.

Figure 2D:
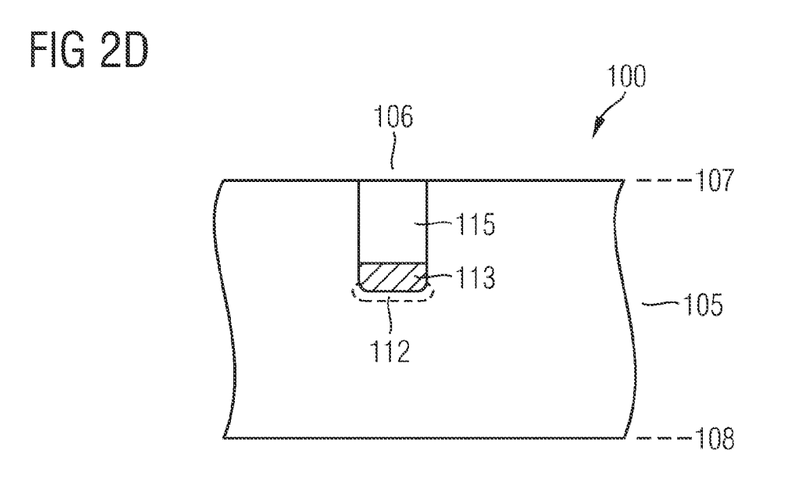
Figure 2E:
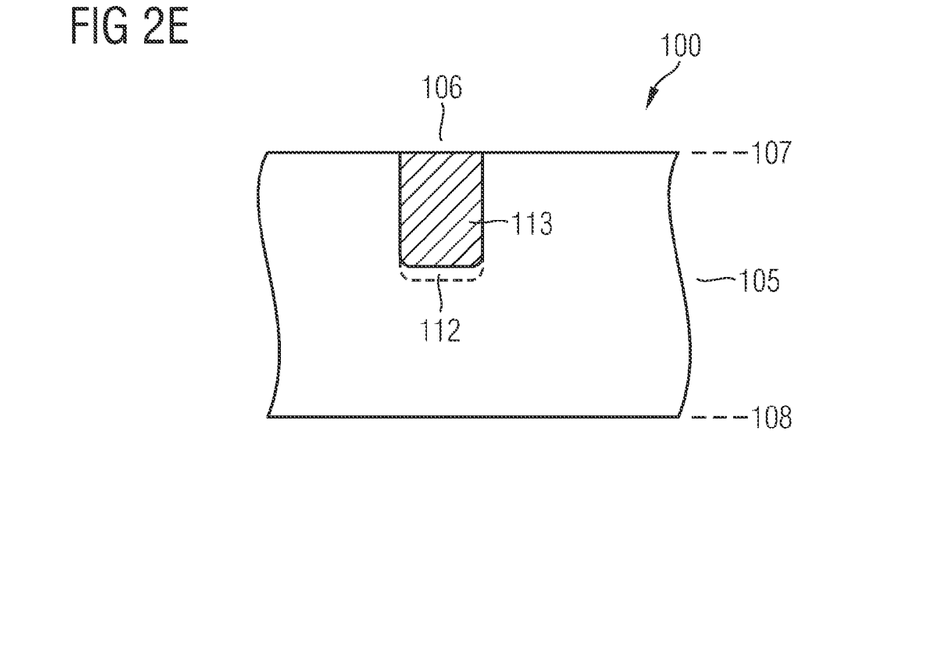

According to another embodiment illustrated in the schematic cross-sectional view of FIG. 2D, the at least one of the ternary carbide and the ternary nitride 113 is arranged at a bottom part of the trench 106. The dielectric 115 is arranged on the at least one of the ternary carbide and the ternary nitride 113. Thus, the dielectric 115 is arranged between the first surface 107 and at least one of the ternary carbide and the ternary nitride 113. The dielectric 115 allows for an electric isolation of the at least one of the ternary carbide and the ternary nitride 113 to the first surface 107. An electric contact to the semiconductor body 105 is effected through a bottom side of the trench 106, e.g. supported by the optional contact layer 112.

Further embodiments of arrangements of the at least one of the ternary carbide and the ternary nitride 113 in the trench 106 are illustrated in FIGS. 2E to 2I. Parts of the trench that are not lined or filled with the at least one of the ternary carbide and the ternary nitride 113 include a filling 118 comprising one or more conducting or insulating material(s) and combinations thereof.

In the embodiments illustrated in FIGS. 2A to 2I, the at least one of the ternary carbide and the ternary nitride 113 may provide an electrical contact to any semiconductor region formed in the semiconductor body 105.

Figure 2F:
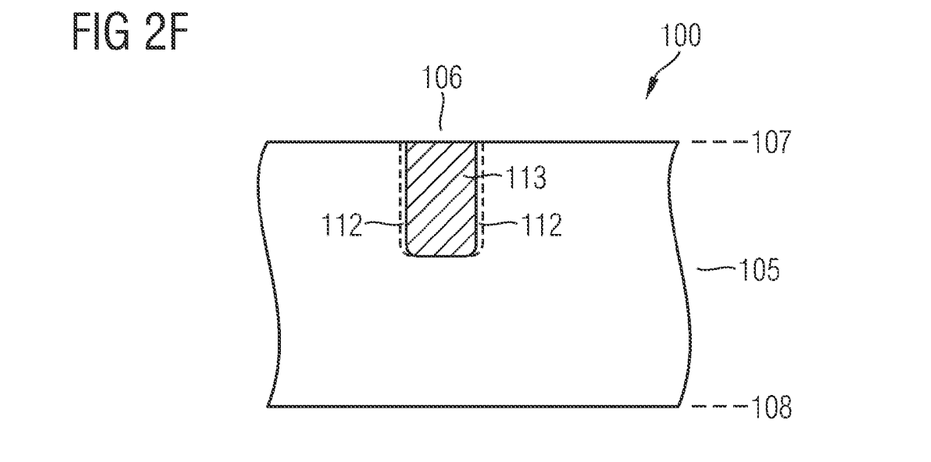
Figure 2G:
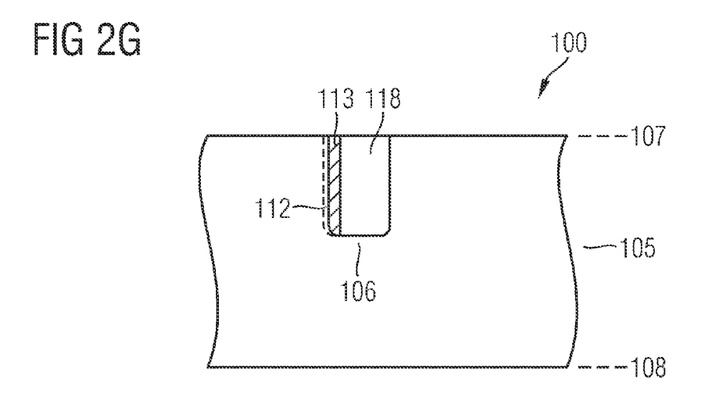
Figure 2H:
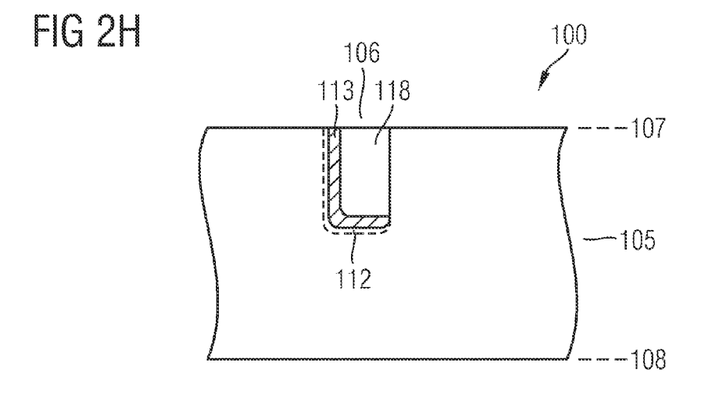
Figure 2I:
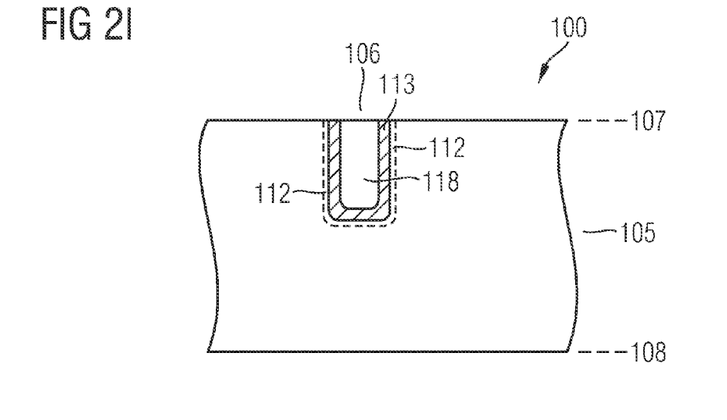
Figure 3A:
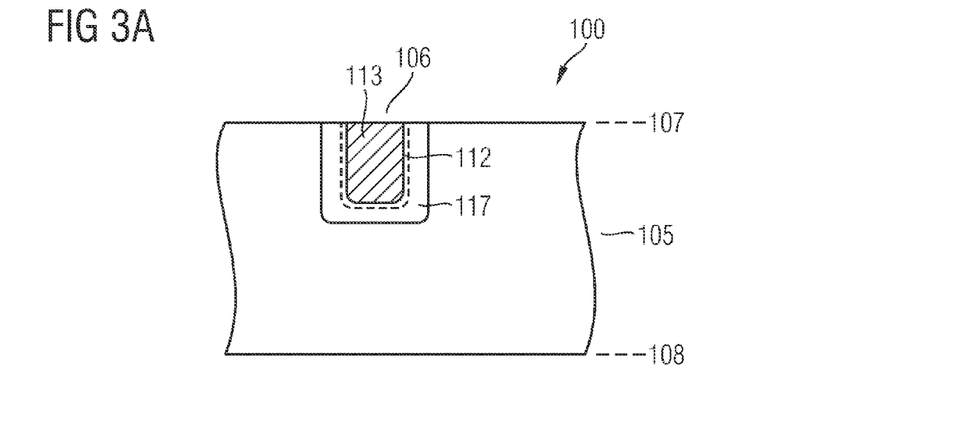

According to an embodiment illustrated in FIG. 3A, the semiconductor region is a doped well region 117 extending from the first surface 107 into the semiconductor body 105. The electric contact to the doped well region 117 of the embodiment illustrated in FIG. 3A is provided by an arrangement of the at least one of the ternary carbide and the ternary nitride 113 as illustrated in FIG. 2A. The electric contact may also be provided by any of the arrangements of the at least one of the ternary carbide and the ternary nitride 113 as illustrated in any of FIGS. 2B to 2I.

Figure 3B:
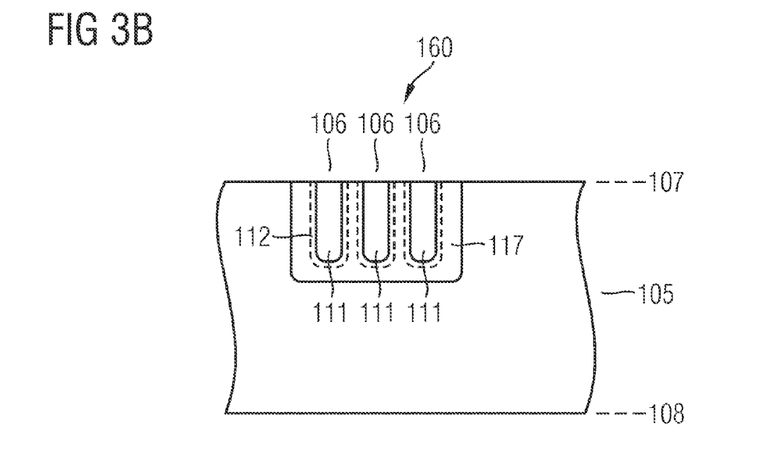

According to an embodiment illustrated in FIG. 3B, the electric contact to the doped well region 117 is effected by a plurality of structures 111, each one of the structures 111 including the at least one of the ternary carbide and the ternary nitride 113 as illustrated in any of FIGS. 2A to 2I.

Figure 3C:
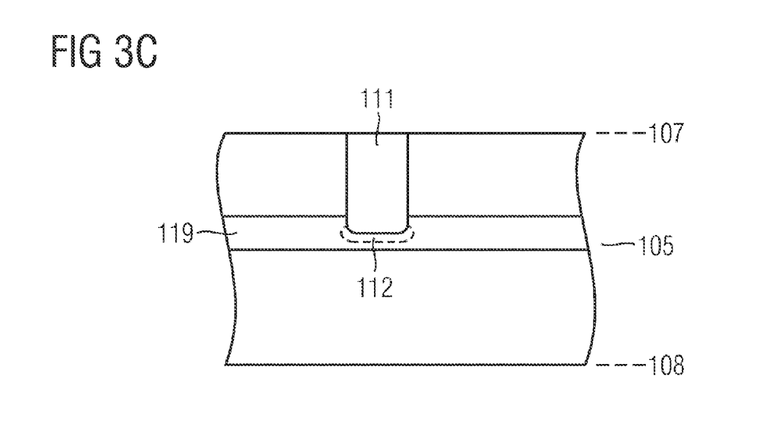

According to another embodiment illustrated in FIG. 3C, the semiconductor region is a doped buried layer 119 buried in the semiconductor body 105 below the first surface 107. The electric contact to the doped buried layer 119 is effected by the structure 111, the structure 111 including the at least one of the ternary carbide and the ternary nitride 113 as illustrated in any of FIGS. 2A to 2I.

The semiconductor body 105 may be provided from a single crystalline semiconductor material, for example silicon (Si), silicon carbide (SiC), germanium (Ge), silicon germanium (SiGe), gallium nitride (GaN) or gallium arsenide (GaAs) by way of example.

According to an embodiment, the semiconductor device 100 is a discrete semiconductor device. According to another embodiment, the semiconductor device 100 is an integrated circuit. Other than an integrated circuit (IC), which consists of a few to billions of active devices manufactured and interconnected on a single semiconductor body, a discrete semiconductor device is a single transistor or a single diode in the semiconductor body without any other active semiconductor elements interconnected thereto. Although passive components such as resistors, capacitors and inductors may be formed in and/or on the semiconductor body, the discrete semiconductor device is specified to perform an elementary electronic function. Although the discrete semiconductor device may include a large number of transistor cells, the discrete semiconductor device is specified to perform an elementary electronic function and is not divisible into separate components functional in themselves as is typical for integrated circuits.

The semiconductor device 100 may include at least one of a vertical semiconductor device and a lateral semiconductor device, for example an IGFET such as a metal oxide semiconductor field effect transistor (MOSFET) including superjunction and non-superjunction IGFETs, IGBTs, electrostatic discharge (ESD) protection devices, diodes, bipolar transistors.

The embodiments described with reference to FIGS. 1 to 3C allow for a number of technical benefits. Due to the thermal stability of the structure 111 comprising the ternary carbide and/or nitride, processes requiring high temperatures may be carried out after formation of the structure 111, thereby improving flexibility of front-end-of-line (FEOL) processing. Moreover, the structure 111 allows for a reduction of resistance of an interconnection between a wiring area above the semiconductor body 105 and a semiconductor region in the semiconductor body 105 such as a doped well region or a buried layer. Since the structure 111 allows for a homogenization of a lateral current density to greater depths of the semiconductor body 105, active area of the semiconductor body 105 can be more efficiently used. Further, the structure 111 allows to dispense with long-lasting thermal processes such as out-diffusion processes of semiconductor regions such as n-doped sinker regions, for example.

Figure 4:
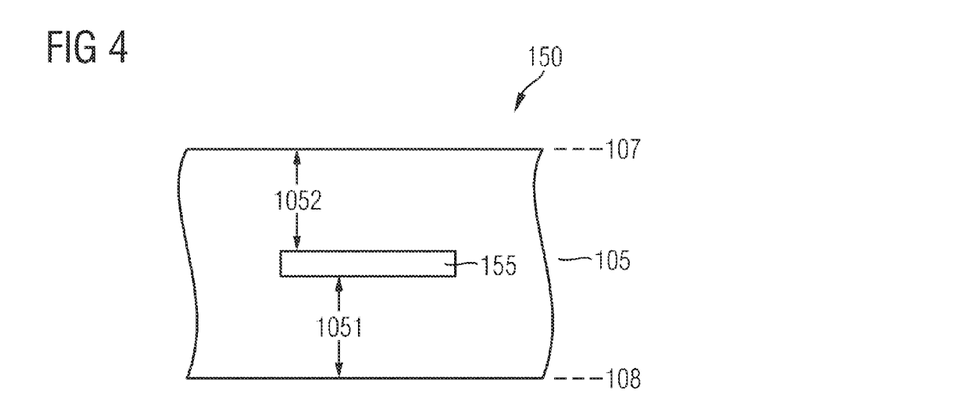
FIGS. 4, 5A and 5B are schematic cross-sectional views of a semiconductor body for illustrating a semiconductor device including at least one of a carbide and a nitride buried in the semiconductor body.

Another embodiment of a semiconductor device 150 is illustrated in FIG. 4. The semiconductor device 150 includes the semiconductor body 105 having the opposite first and second surfaces 107, 108. At least one of a nitride and a carbide 155 is buried in the semiconductor body 105. A second part 1052 of the semiconductor body 105 is between the first surface 107 and the at least one of the nitride and the carbide 155. A first part 1051 of the semiconductor body 105 is between the second surface 108 and the at least one of the nitride and the carbide 155. A melting point of the at least one of the nitride and the carbide 155 is greater than 900° C.

According to an embodiment, the at least one of the carbide and the nitride 155 is a binary or a ternary compound.

According to an embodiment, the at least one of the carbide and the nitride 155 is $A_xB_yR_z$, A being one of Sc, Ti, Cr, V, Zr, Nb, Mo, Hf, and Ta, B being one of Al, Si, P, S, Ga, Ge, As, Cd, In, Sn, Te, and Pb, R being one of C and N, and [x,y,z] being one of [2,1,1], [3,1,2], [4,1,3]. According to another embodiment, the at least one of the carbide and the nitride 155 includes TaN and/or TaC and/or other carbides of W, Ti, Mo, Co.

According to another embodiment, an electrical conductivity of the at least one of the carbide and the nitride 155 is greater than $3\times10^6$ S/m.

According to another embodiment, the at least one of the carbide and the nitride 155 is an electric wiring buried in the semiconductor body 105. Similar to the embodiments illustrated in FIGS. 2A to 2I an optional contact layer and/or dielectric may be arranged between the electric wiring and the semiconductor body 105.

According to an embodiment, the at least one of the carbide and the nitride is a recombination structure arranged laterally in a transition area between a transistor cell array and a junction termination area.

Figure 5A:
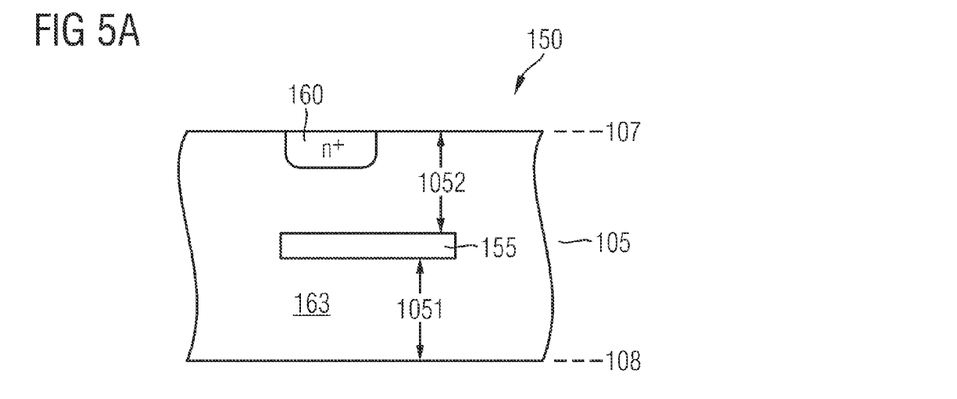

According to the embodiment illustrated in FIG. 5A, the at least one of the carbide and the nitride 155 is a recombination structure arranged vertically between a highly doped emitter region 160 at the first surface 107 and a drift zone 163 in the first part 1051. The doped emitter region 160 may be part of a semiconductor device such as a diode, a transistor or parasitic transistor such as an IGBT, IGFET, JFET or BJT, for example. This allows for a reduction of a transport factor that may be beneficial for improving device robustness.

Figure 5B:
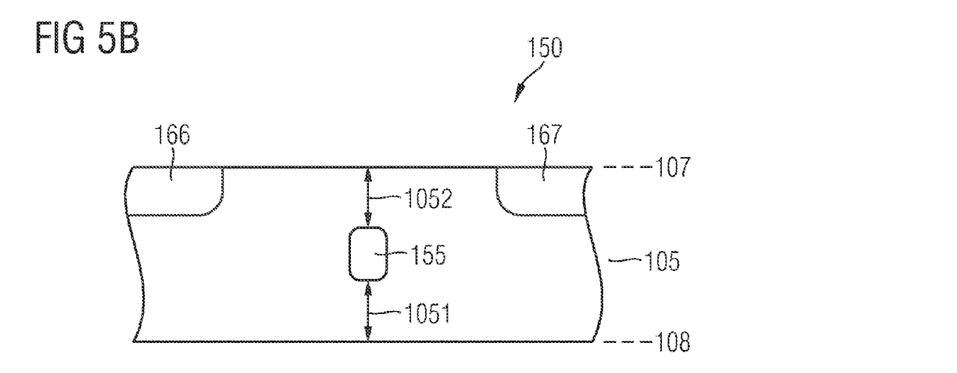

According to the embodiment illustrated in FIG. 5B, the at least one of the carbide and the nitride 155 is a recombination structure laterally arranged between a first active area 166 of a first semiconductor device and a second active area 167 of a second semiconductor device. The recombination structure allows to reduce malfunctions caused in one of the first and second semiconductor devices by minority carriers injected from the other one of the first and second semiconductor devices into the semiconductor body 105.

Figure 6:
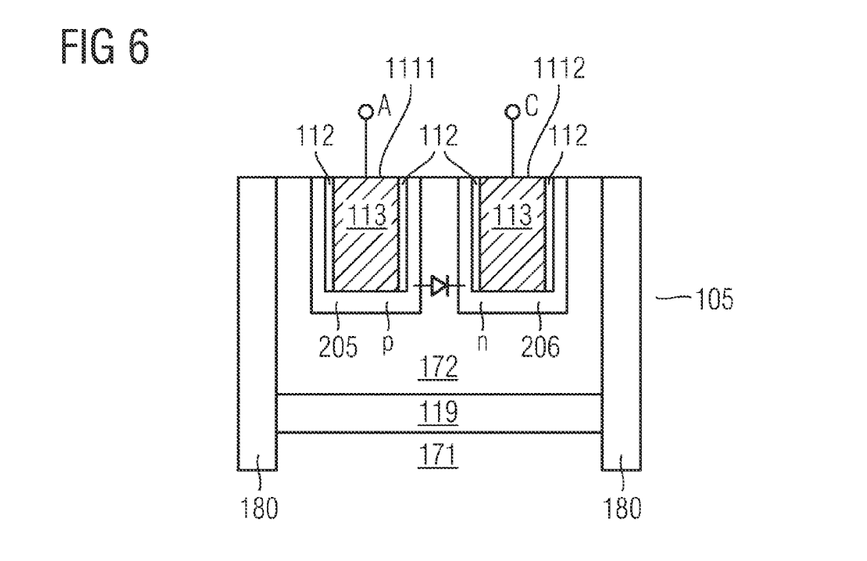
FIGS. 6, 7A and 7B are schematic cross-sectional views of a semiconductor body for illustrating lateral and vertical diodes including at least one of a ternary carbide and a ternary nitride.

An example of a lateral diode 201 including the structure 111 of FIG. 1 is illustrated in the schematic cross-sectional view of the semiconductor body 105 in FIG. 6. The semiconductor body 105 includes the buried layer 119 between a semiconductor substrate 171 and a semiconductor layer 172 such as an epitaxial semiconductor layer. Device isolation is effected by deep trench isolation (DTI) 180.

An anode terminal A of the lateral diode 201 is electrically coupled to an anode region 205 via a first structure 1111 similar to the structure illustrated in FIG. 2F.

A cathode terminal C of the lateral diode 201 is electrically coupled to a cathode anode region 206 via a second structure 1112 similar to the structure illustrated in FIG. 2F.

Since the first and second structures 1111, 1112 allow for a low-ohmic connection of deep parts of the anode and cathode regions 205, 206, a diode current may homogeneously flow with respect to a depth of the anode/cathode region 205, 206. An influence of vertical diode current components may be reduced or suppressed by omitting the contact layer 112 at a bottom side of the at least one of the ternary carbide and the ternary nitride 113.

Figure 7A:
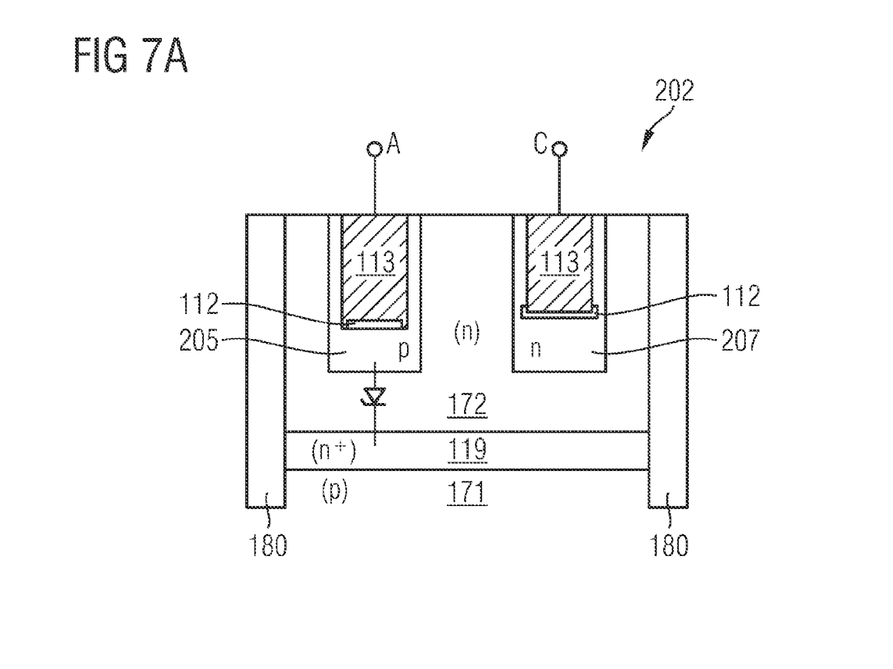

A first example of a vertical diode 202 including the structure 111 of FIG. 1 is illustrated in the schematic cross-sectional view of the semiconductor body 105 in FIG. 7A. The semiconductor body 105 includes the buried layer 119 between the semiconductor substrate 171 and the semiconductor layer 172 such as an epitaxial semiconductor layer. Device isolation is effected by deep trench isolation (DTI) 180.

The anode terminal A of the vertical diode 202 is electrically coupled to the anode region 205 via the at least one of the ternary carbide and the ternary nitride 113 and the contact layer 112.

The cathode terminal C of the vertical diode 202 is electrically coupled to an n-doped sinker 207 of a cathode region via the at least one of the ternary carbide and the ternary nitride 113 and the contact layer 112.

Figure 7B:
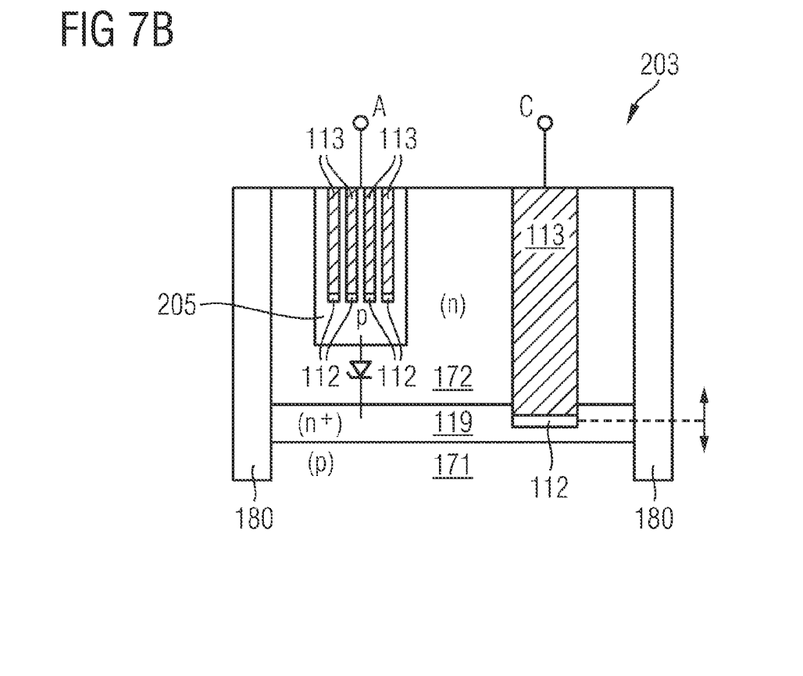

A second example of a vertical diode 203 without the n-doped sinker 207 but including the structure 111 of FIG. 1 is illustrated in the schematic cross-sectional view of the semiconductor body 105 in FIG. 7B. Other than in the example illustrated in FIG. 7A, the cathode terminal is electrically connected to the buried layer 119 via the at least one of the ternary carbide and the ternary nitride 113 and the contact layer 112. Further, the anode region 205 is electrically connected to the anode terminal A via a plurality of the at least one of the ternary carbide and the ternary nitride 113 similar to the embodiment illustrated in FIG. 3B. Since the example illustrated in FIG. 7B allows to dispense with the n-doped sinker 207, process costs of manufacturing the n-doped sinker 207 can be avoided.

Figure 8:
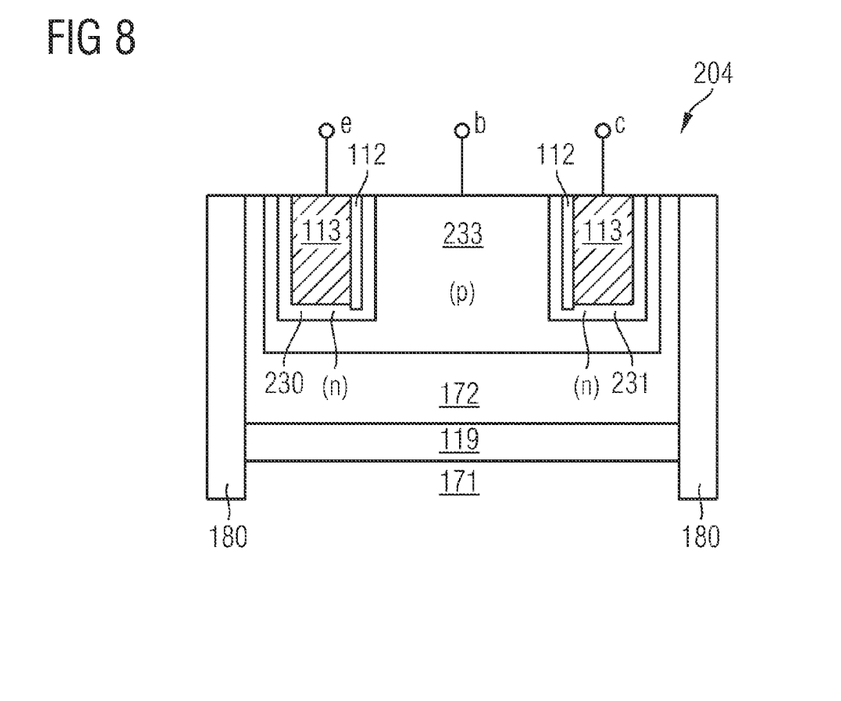
FIG. 8 is a schematic cross-sectional view of a semiconductor body for illustrating an npn bipolar junction transistor (BJT) including at least one of a ternary carbide and a ternary nitride.

An example of a npn bipolar junction transistor (BJT) 204 including the structure 111 of FIG. 1 is illustrated in the schematic cross-sectional view of the semiconductor body 105 in FIG. 8.

An emitter terminal e of the npn BJT 204 is electrically coupled to an n-doped emitter region 230 via the at least one of the ternary carbide and the ternary nitride 113 and the contact layer 112. Likewise, a collector terminal c of the npn BJT 204 is electrically coupled to an n-doped collector region 231 via the at least one 113 of the ternary carbide and the ternary nitride and the contact layer 112. The n-doped emitter and collector regions 230, 231 are formed in a p-well region 233 constituting a base of the npn BJT electrically coupled to a base terminal b.

Since a low-ohmic electrical contact to the emitter and collector regions 230, 231 can be achieved up to a bottom side of the at least one 113 of the ternary carbide and the ternary nitride, a cross-section of lateral current flow between emitter and collector can be increased, thereby improving current flow between emitter and collector.

The examples of lateral and vertical diodes in FIGS. 6, 7A, 7B, and bipolar transistor may be utilized as electrostatic discharge (ESD) protection devices.

Figure 9A:
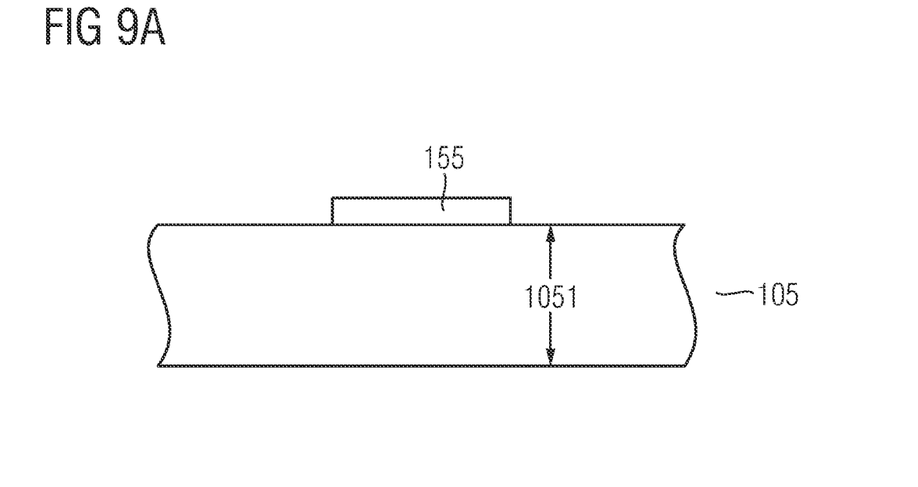
FIGS. 9A and 9B are schematic cross-sectional views of a semiconductor body for illustrating a method of manufacturing a semiconductor device including at least one of a carbide and a nitride buried in the semiconductor body.
Figure 9B:
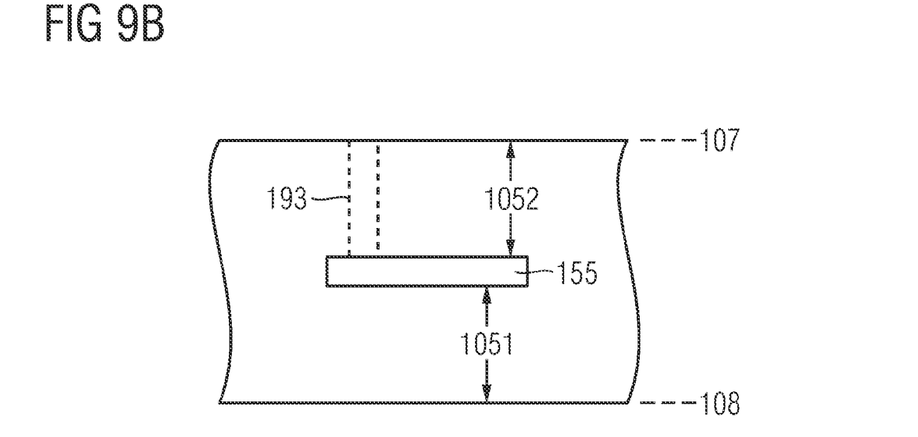

FIGS. 9A and 9B refer to a method of manufacturing a semiconductor device.

The schematic cross-sectional view of FIG. 9A illustrates the first part 1051 of the semiconductor body 105. The at least one of the nitride and the carbide 155 is formed on the first part 1051 of the semiconductor body 105.

Referring to the schematic cross-sectional view of FIG. 9B, the at least one of a nitride and a carbide 155 is buried in the semiconductor body 105 by forming the second part 1052 of the semiconductor body 105 on the first part 1051 and on the at least one of the nitride and the carbide 155 by epitaxial growth. According to an embodiment, the second part 1052 is formed by selective epitaxial growth or epitaxial lateral overgrowth.

According to an embodiment, an electrical conductivity of the at least one of the carbide and the nitride is set greater than $3 \times 10^6$ S/m.

According to another embodiment, a trench 193 is etched into the semiconductor body 105 from the first surface 107 surface of the second part 1052 up to the at least one of the nitride and the carbide 155. Filling the trench 193 with conductive material(s) allows for an electrical interconnection between the at least one of the nitride and the carbide 155 and a wiring area above the semiconductor body 105.

According to an embodiment, the at least one 155 of the carbide and the nitride is $A_xB_yR_z$, A being one of Sc, Ti, Cr, V, Zr, Nb, Mo, Hf, and Ta, B being one of Al, Si, P, S, Ga, Ge, As, Cd, In, Sn, Te, and Pb, R being one of C and N, and [x,y,z] being one of [2,1,1], [3,1,2], [4,1,3].

According to another embodiment, an electrical conductivity of the at least one of the carbide and the nitride 155 is greater than $3 \times 10^6$ S/m.

According to another embodiment, the at least one of the carbide and the nitride 155 is an electric wiring buried in the semiconductor body 105.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a trench extending into a semiconductor body from a first surface; and
at least one of a ternary carbide and a ternary nitride in the trench,
wherein the at least one of the ternary carbide and the ternary nitride fills the trench completely.

2. The semiconductor device of claim 1, wherein the at least one of the ternary carbide and the ternary nitride is $A_xB_yR_z$, wherein A is one of Sc, Ti, Cr, V, Zr, Nb, Mo, Hf, and Ta, wherein B is one of Al, Si, P, S, Ga, Ge, As, Cd, In, Sn, Te, and Pb, wherein R is one of C and N, and wherein [x,y,z] is one of [2,1,1], [3,1,2], [4,1,3].

3. The semiconductor device of claim 1, further comprising a dielectric between the at least one of the ternary carbide and the semiconductor body.

4. The semiconductor device of claim 1, wherein the trench is a contact trench including the at least one of the ternary carbide and the ternary nitride as a conductive filling electrically coupled to the semiconductor body.

5. The semiconductor device of claim 4, further comprising a contact layer comprising at least one of a silicide and a highly doped semiconductor material between the at least one of the ternary carbide and the ternary nitride and the semiconductor body.

6. A semiconductor device, comprising:
a semiconductor body having opposite first and second surfaces; and
at least one of a nitride and a carbide buried in the semiconductor body, wherein a second part of the semiconductor body is between the first surface and the at least one of the nitride and the carbide, and a first part of the semiconductor body is between the second surface and the at least one of the nitride and the carbide,
wherein a melting point of the at least one of the nitride and the carbide is greater than 900° C.

7. The semiconductor device of claim 6, wherein the at least one of the carbide and the nitride is a binary or a ternary compound.

8. The semiconductor device of claim 6, wherein the at least one of the carbide and the nitride is $A_xB_yR_z$, wherein A is one of Sc, Ti, Cr, V, Zr, Nb, Mo, Hf, and Ta, wherein B is one of Al, Si, P, S, Ga, Ge, As, Cd, In, Sn, Te, and Pb, wherein R is one of C and N, and wherein [x,y,z] is one of [2,1,1], [3,1,2], [4,1,3].

9. The semiconductor device of claim 6, wherein an electrical conductivity of the at least one of the carbide and the nitride is greater than $3 \times 10^6$ S/m.

10. The semiconductor device of claim 9, further comprising an electric wiring buried in the semiconductor body, the electric wiring comprising the at least one of the carbide and the nitride.

11. The semiconductor device of claim 10, further comprising at least one of a contact layer and a dielectric between the electric wiring and the semiconductor body.

12. The semiconductor device of claim 6, wherein the at least one of the carbide and the nitride is a recombination structure arranged vertically between a highly doped emitter region at the first surface and a drift zone.

13. The semiconductor device of claim 6, wherein the at least one of the carbide and the nitride is a recombination structure arranged laterally between a first active area of a first semiconductor element and a second active area of a second semiconductor element.

14. The semiconductor device of claim 6, wherein the at least one of the carbide and the nitride is a recombination structure arranged laterally in a transition area between a transistor cell array and a junction termination area.

15. A method of manufacturing a semiconductor device, the method comprising:
forming at least one of a nitride and a carbide on a first part of a semiconductor body; and
burying the at least one of the nitride and the carbide in the semiconductor body by forming a second part of the semiconductor body on the first part and on the at least one of the nitride and the carbide by epitaxial growth.

16. The method of claim 15, wherein the second part is formed by selective epitaxial growth or epitaxial lateral overgrowth.

17. The method of claim 15, wherein an electrical conductivity of the at least one of the carbide and the nitride is greater than $3 \times 10^6$ S/m.

18. The method of claim 17, further comprising etching a trench into the semiconductor body from a surface of the second part up to the at least one of the nitride and the carbide.

19. The method of claim 15, wherein the at least one of the carbide and the nitride is $A_xB_yR_z$, wherein A is one of Sc, Ti, Cr, V, Zr, Nb, Mo, Hf, and Ta, wherein B is one of Al, Si, P, S, Ga, and Ge, wherein R is one of C and N, and wherein [x,y,z] is one of [2,1,1], [3,1,2], [4,1,3].

20. A semiconductor device, comprising:
a trench extending into a semiconductor body from a first surface;
at least one of a ternary carbide and a ternary nitride in the trench, wherein the trench is a contact trench including the at least one of the ternary carbide and the ternary nitride as a conductive filling electrically coupled to the semiconductor body; and a contact layer comprising at least one of a silicide and a highly doped semiconductor material between the at least one of the ternary carbide and the ternary nitride and the semiconductor body.

* * * * *